United States Patent
De Carolis et al.

(10) Patent No.: US 7,896,711 B2
(45) Date of Patent: Mar. 1, 2011

(54) MODULAR ELECTRICAL BUS SYSTEM

(75) Inventors: Enrico De Carolis, Oakland Township, MI (US); John F. Eskew, Phoenix, AZ (US); Adam Gibson, Milford, MI (US); Michael W. Hundt, Brighton Township, MI (US)

(73) Assignee: Numatics, Incorporated, Novi, MI (US)

( * ) Notice: Subject to any disclaimer, the term of this patent is extended or adjusted under 35 U.S.C. 154(b) by 0 days.

(21) Appl. No.: 12/797,728

(22) Filed: Jun. 10, 2010

(65) Prior Publication Data

US 2010/0248556 A1 Sep. 30, 2010

Related U.S. Application Data

(62) Division of application No. 11/880,348, filed on Jul. 20, 2007, now Pat. No. 7,753,740.

(51) Int. Cl.
*H01R 9/22* (2006.01)
(52) U.S. Cl. ...................................... 439/717
(58) Field of Classification Search .................. 439/190, 439/55, 717, 715, 532, 76.2; 361/732, 728, 361/785; 700/300
See application file for complete search history.

(56) References Cited

U.S. PATENT DOCUMENTS

| | | | |
|---|---|---|---|
| 3,157,449 A | 11/1964 | Hennessey | |
| 4,272,689 A | 6/1981 | Crosby et al. | |
| 4,399,836 A | 8/1983 | de Versterre et al. | |
| 5,183,405 A | 2/1993 | Elicker et al. | |
| 5,249,979 A | 10/1993 | Deinhardt et al. | |
| 5,363,075 A | 11/1994 | Fanucchi | |
| 5,457,594 A | 10/1995 | Stoll et al. | |
| 5,458,048 A | 10/1995 | Hohner | |
| 5,493,194 A | 2/1996 | Damiano et al. | |
| 5,566,718 A | 10/1996 | Nagai et al. | |
| 5,611,696 A | 3/1997 | Donner et al. | |
| 5,616,965 A | 4/1997 | Wolf et al. | |
| 5,617,898 A | 4/1997 | Nagai et al. | |
| 5,666,994 A | 9/1997 | Stoll et al. | |
| 5,699,830 A | 12/1997 | Hayashi et al. | |
| 5,741,142 A | 4/1998 | Dux et al. | |
| 5,765,589 A | 6/1998 | Stoll et al. | |
| 5,887,623 A | 3/1999 | Nagai et al. | |
| 5,938,461 A * | 8/1999 | Biermeier et al. | 439/212 |
| D425,483 S | 5/2000 | Bechtold et al. | |
| 6,062,872 A | 5/2000 | Strange et al. | |
| 6,081,048 A | 6/2000 | Bergmann et al. | |
| 6,098,117 A | 8/2000 | Foote et al. | |

(Continued)

OTHER PUBLICATIONS

International Search Report and Written Opinion for International Application No. PCT/US07/25677, Applicant—Numatics, Incorporated, Mailing Date: Aug. 29, 2008, 7 pages.

*Primary Examiner* — Edwin A. Leon
(74) *Attorney, Agent, or Firm* — Reisong Ethington P.C.

(57) ABSTRACT

A modular electrical bus system for a valve manifold has a main communication module with a plurality of modular I/O units each having a plurality of I/O fittings being both electrically and mechanically connectable together via a bridge member connecting adjacent units and the main communication module. At least one of the modular I/O units is also mechanically separable from and maintains communication connection to the main communication module. One or both of the modular IO units and main communication module may have an alpha-numeric display.

28 Claims, 8 Drawing Sheets

U.S. PATENT DOCUMENTS

| | | |
|---|---|---|
| 6,123,585 A | 9/2000 | Hussong et al. |
| 6,164,335 A | 12/2000 | Hayashi et al. |
| 6,170,527 B1 | 1/2001 | Hayashi et al. |
| 6,173,731 B1 | 1/2001 | Ottliczky |
| 6,173,745 B1 | 1/2001 | Hayashi et al. |
| 6,213,153 B1 | 4/2001 | Hayashi et al. |
| 6,216,738 B1 | 4/2001 | Ruckwied et al. |
| 6,222,717 B1 | 4/2001 | Waas et al. |
| 6,246,559 B1 | 6/2001 | Sanders et al. |
| 6,382,257 B2 | 5/2002 | Mead et al. |
| 6,427,723 B2 | 8/2002 | Bogdanowicz et al. |
| 6,449,515 B2 | 9/2002 | Imoto |
| 6,475,036 B2 | 11/2002 | Morikawa |
| 6,527,599 B2 | 3/2003 | Bechtold et al. |
| 6,634,910 B2 | 10/2003 | Lieb et al. |
| 6,655,966 B2 | 12/2003 | Rothemel et al. |
| 6,672,889 B2 * | 1/2004 | Biermeier et al. ............ 439/212 |
| 6,820,156 B1 | 11/2004 | Miller et al. |
| 6,881,101 B2 | 4/2005 | Sichner et al. |
| 6,916,194 B2 | 7/2005 | Sichner et al. |
| 7,204,273 B1 | 4/2007 | Zub et al. |
| 7,244,143 B2 | 7/2007 | Wagener |
| 7,397,668 B2 | 7/2008 | Sekine et al. |
| 7,444,207 B2 | 10/2008 | Nickerson et al. |
| 7,601,013 B2 * | 10/2009 | Wagener et al. ............ 439/110 |
| 2001/0003289 A1 | 6/2001 | Mead et al. |
| 2002/0170609 A1 | 11/2002 | Hendrickx |
| 2003/0005196 A1 | 1/2003 | Reed |
| 2005/0098337 A1 | 5/2005 | Brock et al. |

* cited by examiner

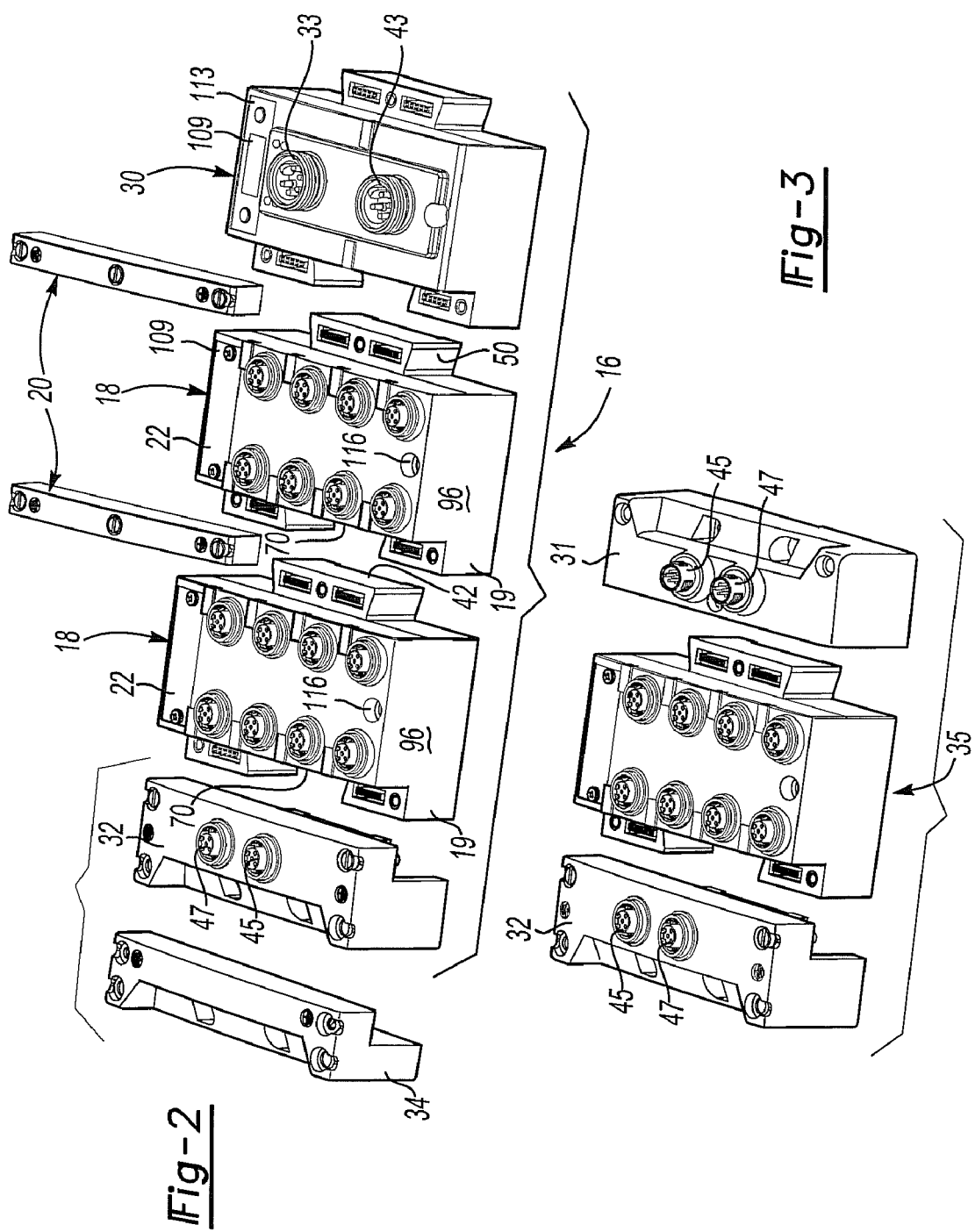

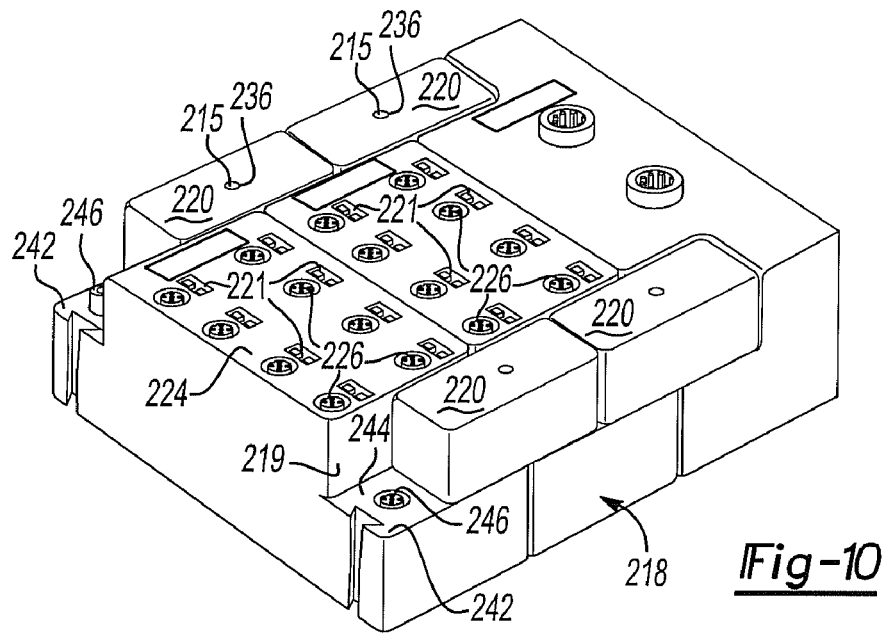
Fig-10
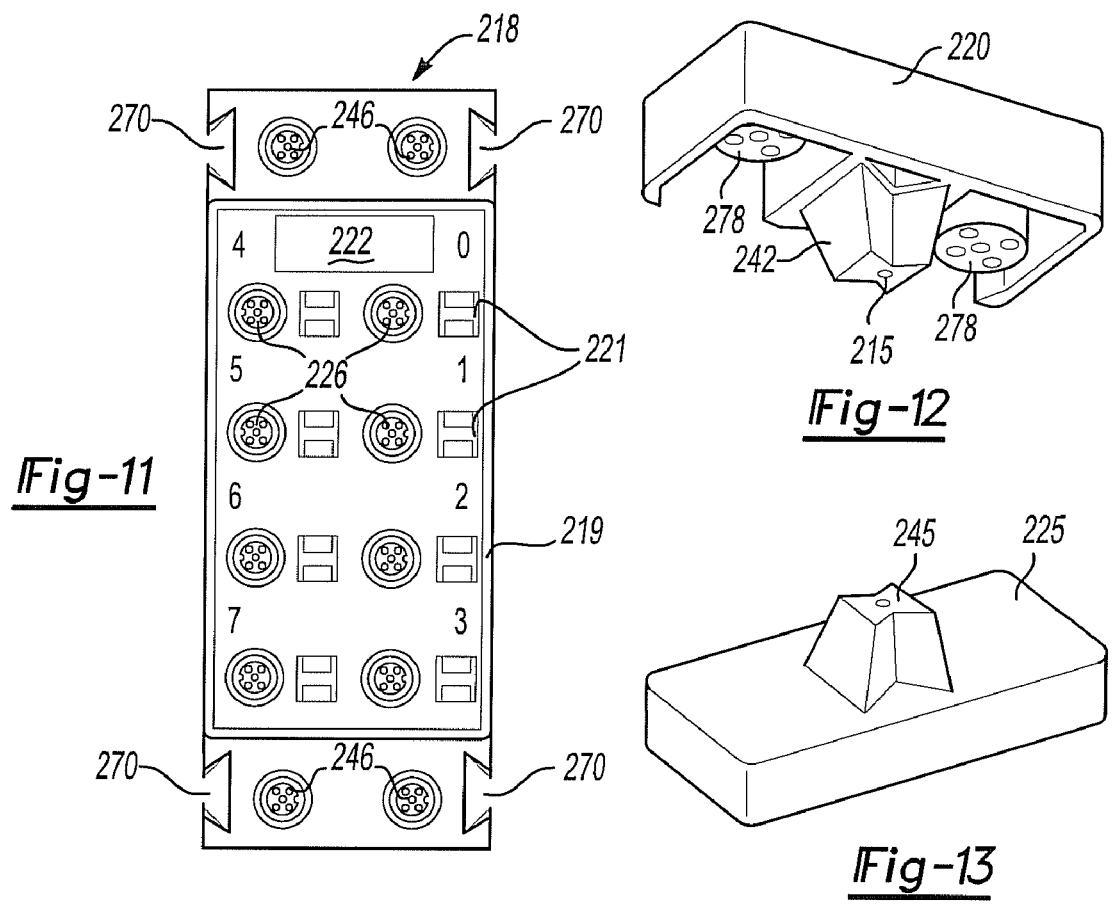
Fig-11
Fig-12
Fig-13

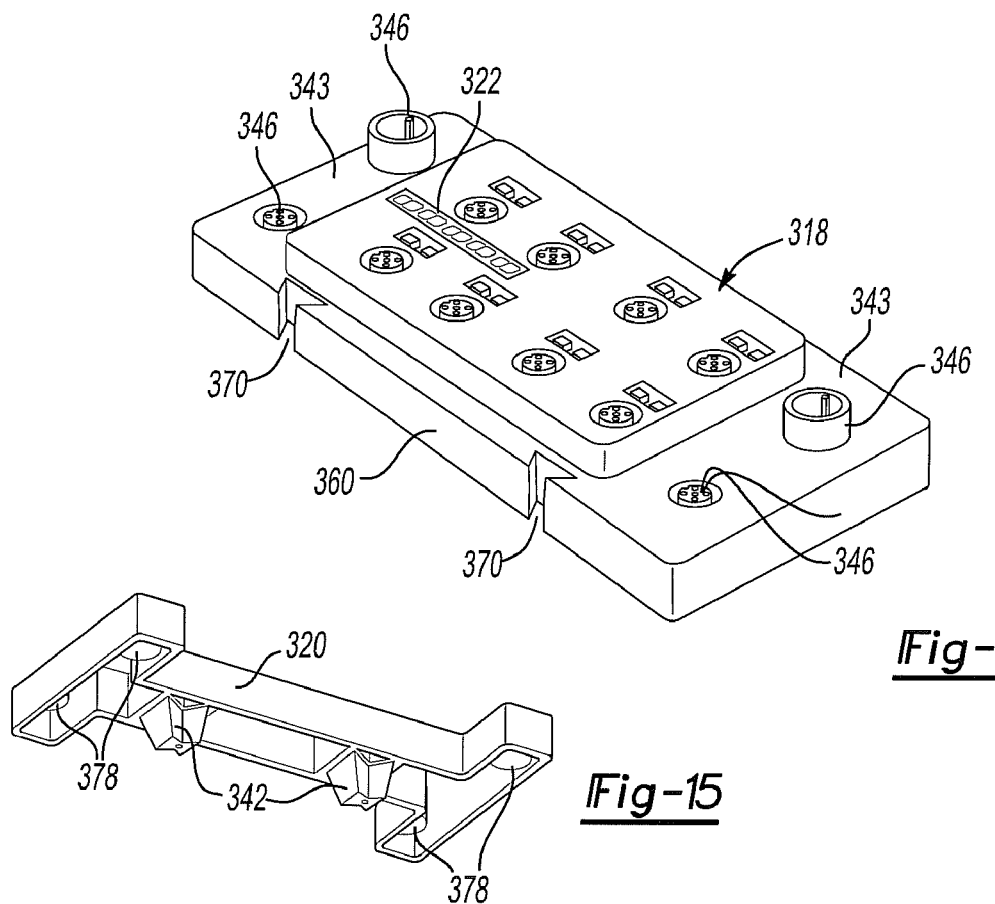
Fig-14
Fig-15
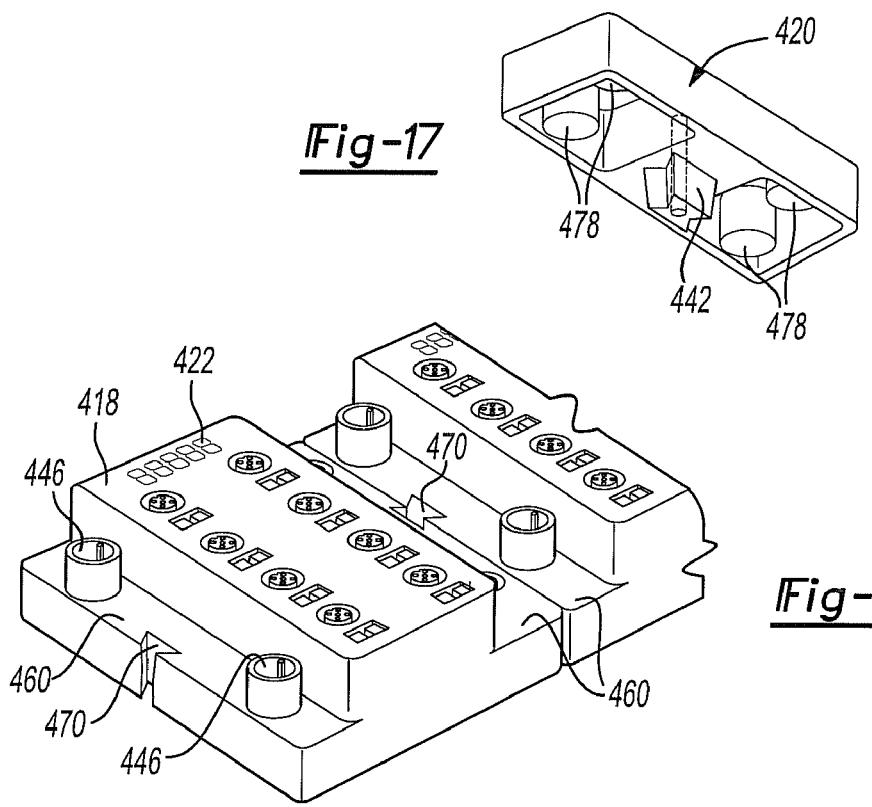
Fig-17
Fig-16

MODULAR ELECTRICAL BUS SYSTEM

RELATED APPLICATION

We hereby claim the benefit under 35 U.S.C. §120 of filing this application which is a divisional application of pending U.S. Ser. No. 11/880,348 filed on Jul. 20, 2007.

TECHNICAL FIELD

The field of this invention relates to electrical bus systems that can be used with pneumatic valve manifolds.

BACKGROUND OF THE DISCLOSURE

Industrial automation uses many control devices. One useful control device combines electrical actuated solenoids that control the direction of hydraulic or pneumatic flow for actuating other downstream devices. In recent times these valves have been controlled by industrial networks (fieldbusses) whose communication modules are often mounted adjacent the valve manifold.

Efforts have been made to modularize the fieldbus with input-output modules (I/O) so additional I/O components can be more easily added on or replaced. Each input/output module has a plurality of fittings which can all be used as input fittings, all be used as output fittings, or as a mix of input and output fittings. The modularity is desirable to remotely place certain I/O modules closer to a particular sensor or machine. In the past, when such remote mounting is achieved, different remote components must be used.

What is needed is a modular electrical bus system with I/O modules that can be easily mounted together and separable to be used remotely from the main communication module. Further what is needed is an I/O module and fieldbus module that has a graphic visual display that can display status and varying parameters.

SUMMARY OF THE DISCLOSURE

In accordance with one aspect of the invention a modular electrical bus system for a valve manifold has a first module and second module juxtaposed against each other with complementary interlocking shapes to interlock along a mounting plane. Preferably, the first module has an interlocking extension and the second module has an interlocking cavity. Preferably the bus system has the first and second modules being in the form of modular I/O units each having a plurality of I/O fittings being both electrically and mechanically connectable together via a bridge member connecting adjacent units together. At least one of the modular I/O units is also mechanically separable from and maintains communication connection to the bus system. The bridge member locks the first and second modules together perpendicularly to the mounting plane.

Each modular I/O unit has a main front face and sides with recessed front faces with respect to a main front face. The sides house electrical fittings that are interposed between two main front faces of two adjacent modular I/O units. The bridge fits in a gap formed in front of the recessed front faces between the main front faces of two adjacent modular I/O units to mechanically connect and affix to both adjacent modular I/O units. In one embodiment, each bridge member has complementary electrical fittings to connect to the electrical fitting of the adjacent modular I/O units to electrically connect the adjacent modular I/O units. Preferably, the first and second front face sections are complementarily shaped to interlock adjacent modules together in a plane of the main front face. In one embodiment, the first and second front face sections have complementary shaped dove tail female and male shapes to interlock together. The front face section at the one side of the housing and the second front face section at the other side of the housing are aligned at the same distance from the main front face. The first electrical connection is laterally aligned with the second electrical connection of an adjacent module when the adjacent modules are connected together.

In another embodiment, the modular I/O units have a generally rectangular housing with a central front face with a plurality of I/O connectors. The housing has an upper shoulder and lower shoulder with each shoulder having two electrical connectors thereon. The bridge members both electrically and mechanically couple the upper and lower shoulders together. The modular I/O units are juxtaposed adjacent each other with the bridge members having an interlocking protrusion that is received within complementary receptacles of adjacent modular I/O units. The bridge members have a respective aperture therethrough aligned with at least one receptacle for receiving a fastener that passes through the aperture and receptacle to pass through the I/O units to attach the I/O units to a mounting surface. The two adjacent modular I/O units may have opposing receptacles with dovetail shapes that face each other. The protrusion may have a tapered dovetail shaped section that is received in both facing female receptacles.

In one embodiment, the modular I/O units have a housing with a respective electrical connector mounted in proximity to opposite sides. The bridge member has mating electrical connections for connecting to two adjacent modular I/O units or main communication module. The modular I/O may have its housing having an upper shoulder and lower shoulder with each shoulder having two electrical connectors thereon. The bridge member both electrically and mechanically couples the respective upper and lower shoulders of adjacent units together.

In accordance with another aspect of the invention, an electrical bus communication system has a modular unit with an alpha-numeric graphical display for displaying information relative thereto.

According to another aspect of the invention, an electrical bus communication assembly has main communication module and a bank of modular I/O units mounted to the side of the main communication module and adjacent each other. Each modular I/O unit has an electrical fitting in proximity to each side thereof. A bridge member spans and connects the two adjacent modular I/O units. The bridge member has complementary electrical fittings for engaging the electrical fittings of two adjacent I/O units. A fastener optionally mounts the modular I/O units to a mounting base. The bridge member also mechanically connects the adjacent modular I/O units together such that when the bridge members are disengaged from one modular I/O unit, the one modular I/O unit can be removed from the mounting base and the bank of modular I/O units without removing the left and right adjacent modular I/O units. Each modular I/O unit encloses electronic boards therein and is distributable to a remote location and electrically connectable to the main bank and main communication module.

An I/O module for an electrical bus system may, according to another aspect of the invention, have a housing with a main front face and a first electrical connection proximate to one side and a second electrical connection proximate another side. A plurality of I/O fittings are on the main front face of the housing. One side of the housing is shaped to fit adjacent the other side of an adjacent I/O module and to receive a bridge connector. The alpha-numeric graphical display preferably has operable buttons for scrolling through menus and different indicia relating to different parameters of the I/O module.

According to another aspect of the invention, an electrical bus assembly has a main communication module and a bank of modular I/O units mounted to the side of the main communication module and adjacent each other. Each modular I/O unit has an electrical fitting in proximity to each side thereof that is connected to a respective complementary electrical fitting of an adjacent module. The one modular I/O unit is removable from the bank of modular I/O units without removal of the left and right adjacent modular I/O units. Each modular I/O unit encloses electronic boards therein and is distributable to a remote location and electrically connectable to the main bank and main communication module. The main communication module is constructed to automatically address each modular I/O unit with a sub-network address on either the main bank or on the remote location. The I/O modules each constructed to automatically select a choice of two power sources fed into each I/O unit.

BRIEF DESCRIPTION OF THE DRAWINGS

Reference now is made to the accompanying drawings in which:

FIG. 2 is a partially exploded view of the main bank of I/O modules and connector clips shown in FIG. 1 shown with a fieldbus module and optional terminating plate and bus-out plate;

FIG. 3 is an exploded view of remote I/O station shown in FIG. 1;

FIG. 10 is a perspective view of an second embodiment according to the invention;

FIG. 11 is a front plan view of one I/O module shown in FIG. 10;

FIG. 12 is a bottom perspective view of a connecting clip shown in FIG. 10;

FIG. 13 is a top perspective view of a backing clip to be connected to the connection clip in FIG. 10;

FIG. 14 is a front perspective view of another embodiment of an I/O module according to the invention;

FIG. 15 is a bottom perspective view of a connecting clip to be used with the I/O shown in FIG. 14;

FIG. 16 is a front perspective view of another embodiment showing adjacent I/O modules; and FIG. 17 is a bottom perspective view of the connector clip for the I/O module shown in FIG. 16.

DETAILED DESCRIPTION OF THE PREFERRED EMBODIMENT

Figure 1:
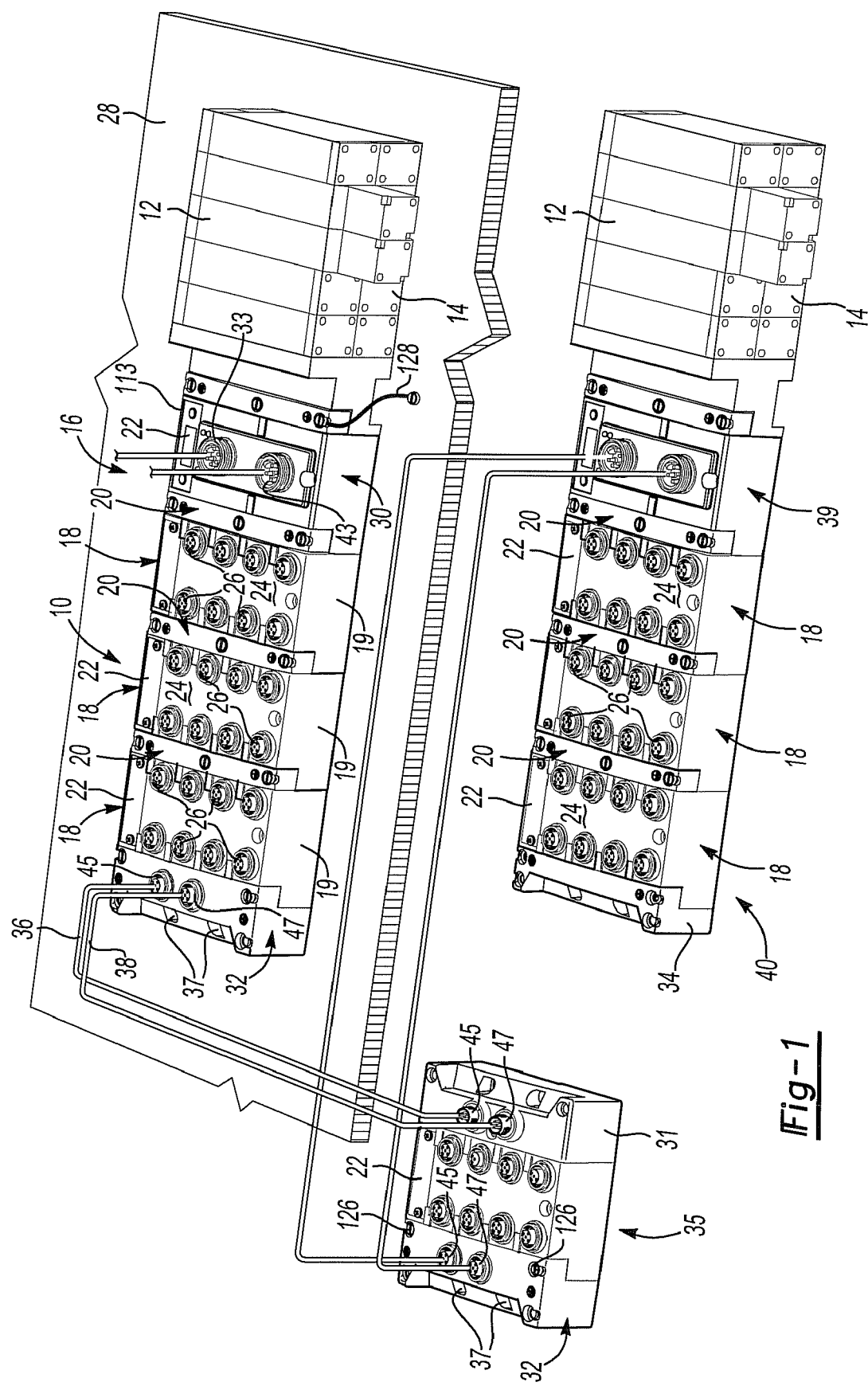
FIG. 1 is a perspective and partially schematic overview of one arrangement according to an embodiment of the invention.

Referring now to FIG. 1, one arrangement of a modular fieldbus system 10 provides control for solenoid actuated valves 12 which controls directional flow in a valve manifold 14 in a main station 16. The main station 16 has main communication module 30 with an alpha-numeric display 22 mounted thereon. The fieldbus system can also have a plurality of I/O modules 18 connected together via bridge members, which are hereinafter referred to as clips 20 that bridge over and connect two adjacent modules 18 and physically and electrically connect together to the main communication module 30. The main communication module 30 connects to and controls the solenoid valves 12. For purposes of this invention, a module may be modular to be connected with other units or may be a stand alone unit.

The I/O modules 18 may be banked and mounted on a mounting surface 28 such as a machine wall or panel through an available DIN RAIL system or directly fastened to the mounting surface 28. At one end of the main station 16 of the modules 18, main communication module 30 interfaces with a bank of solenoids 12 and a valve manifold 14. The main communication module 30 has a communication fitting 33 and power fitting 43 for main and auxiliary power supplies. The other end of the station 16 of I/O modules has a bus-out mounting plate 32 or, as shown in FIG. 2, terminating mounting plate 34. Both plates 32 and 34 have apertures 37 suitable to receive a DIN compliant fastener for mounting to a DIN RAIL mounting system.

The system is modular such that an I/O module 18 may be mounted at a remote station 35 as shown in FIG. 1 remotely from the main station 16 of I/O modules 18. The remote I/O module 18 is identical in structure to the other modules 18 in the main station 16 and is electrically connected and in communication with the main communication module 30 via a bus cable 36 and optional power cable 38. The remote I/O module 18 has a bus-in mounting plate 31 and a bus-out mounting plate 32 attached at opposite ends of the I/O module 18, one to receive bus cables 36 and another to extend other bus cables 36 to another optional substation 40. Bus-in plate 31 also has apertures suitable to receive a DIN RAIL compliant fastener. Each bus-in and bus-out plate 31 and 32 has two electrical fittings 45 and 47. The upper located fitting 45 is used for network power and communication through cables 36 and the lower fitting 47 is used for transfer of auxiliary power through cables 38 to the remotely mounted I/O modules 18 as described later. Other remote module stations 35 with a desired number of I/O modules 18 may be serially attached in the same fashion.

Other substations 40 through the use of electrical bus cables 36 and 38 connect to fitting 45 and 47 and communication module 39 for controlling the bank of solenoids 12 and valve manifold 14 in substation 40. It is of course foreseen that wireless power and communication transmission may also replace bus cables 36 and 38.

Figure 4:
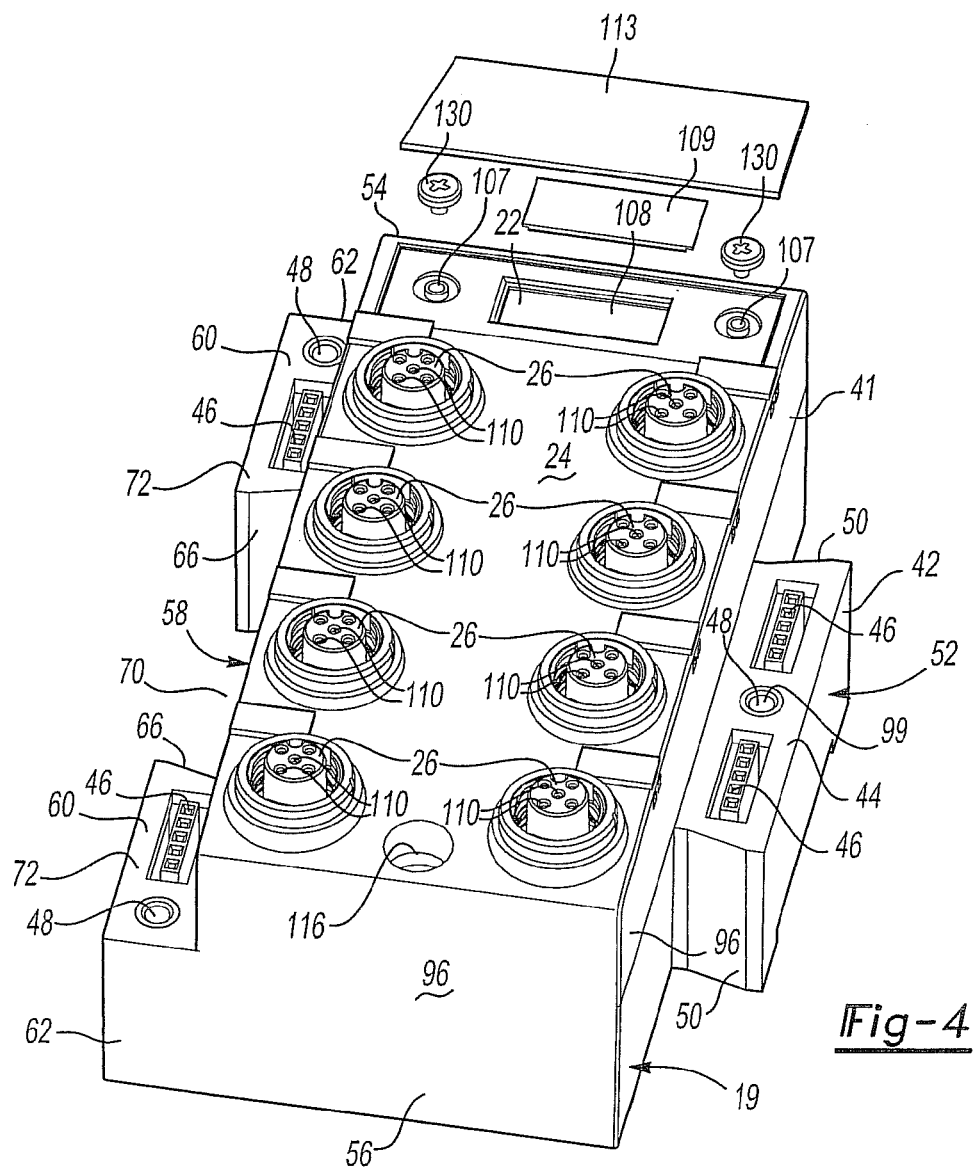
FIG. 4 is an enlarged perspective view of one I/O module shown in FIG. 1.

The structure of each module 18 is more clearly shown in FIGS. 4-9. Each I/O module 18 is self contained with a housing 19. A cover 96 of housing 19 mounts an alpha-numeric graphical display 22 on the front main face 24 thereof. The front main face 24 also has a plurality of I/O connections or fittings 26. Each I/O fitting 26 may have a commercially acceptable five pin connection that can be used to power and communicate with a variety of sensors and devices (not shown). Other pin connections may also be acceptable. Each fitting 26 may be used either as an input or an output so that any individual module 18 may have all inputs, all outputs or a mixture of inputs and outputs with either digital or analog signals. The cover 96 has a window 108 for the display 22 that may have a protective transparent cover 109. Cover 96 also has apertures 110 for I/O fittings 26. Apertures 107 may receive operating buttons 130 for working the menus seen on the display 22. As shown in FIG. 4, an overlay 113 seals window 108 and cover 109 in the main front face when the alpha-numeric graphical display is in position.

One side 41 of housing 19 has an interlocking extension 42 extending laterally. The interlocking extension 42 has a front face 44 recessed from main front face 24. The front face has electrical fittings 46 and a central threaded insert 48. The shown interlocking extension may be dovetail in shape with angled side walls 50 and a straight end wall 52 parallel to side 58. The extension 42 is centrally located between the upper end 54 and lower end 56 of housing 19.

Figure 5:
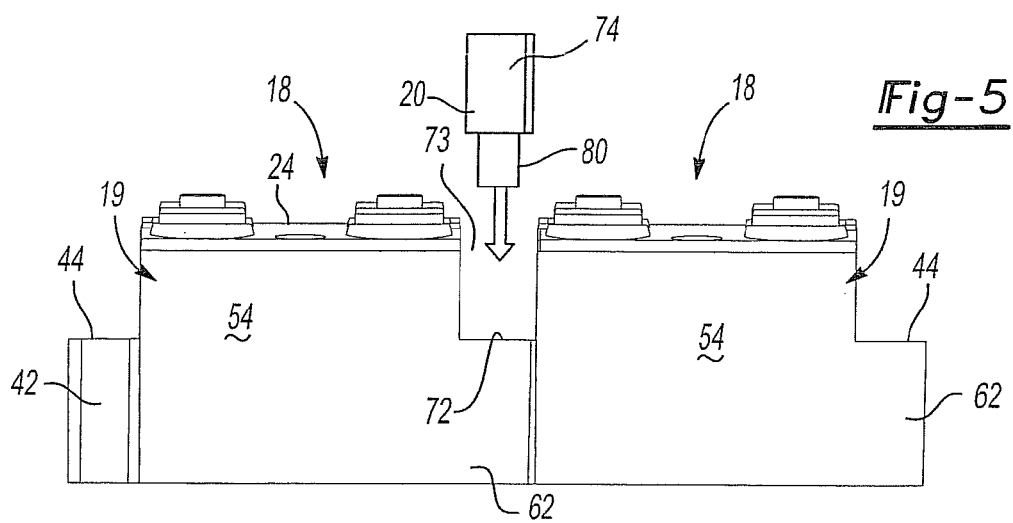
FIG. 5 is a partially exploded top side elevational view of adjacent I/O modules and a connector clip.

The other side 58 of housing 19 has two complementary shaped interlocking extensions 60 near the upper end 54 and lower end 56. The extensions have outer side walls 62 that are flush with respective upper and lower ends 54 and 56 of housing 19. Inner angled walls 66 are spaced appropriately to form a dove tail shaped cavity 70 to fit extension 42 of an adjacent module 18. Each extension 60 has a front face 72 that is also recessed with respect to main front face 24 in the same fashion as extension 42. Each extension 60 has an electrical fitting 46 and a threaded insert 48. As shown in FIGS. 2, 3 and 5, adjacent modules 18 fit together by vertically dropping or sliding one module with respect to another to laterally lock the modules together via the interlocking extension 42 and extensions 60. In other words the two modules are locked together along the mounting surface plane 28 shown in FIG. 1. A gap 73 as most clearly seen in FIG. 5 is then formed therebetween extending down to the vertically aligned front faces 44 and 72 of extensions 60 and extension 42. Each gap 73 receives clip 20 to complete the assembly and prevent the adjacent modules 18 from lifting with respect to each other by being fastened into threaded insert 48.

Figure 6:
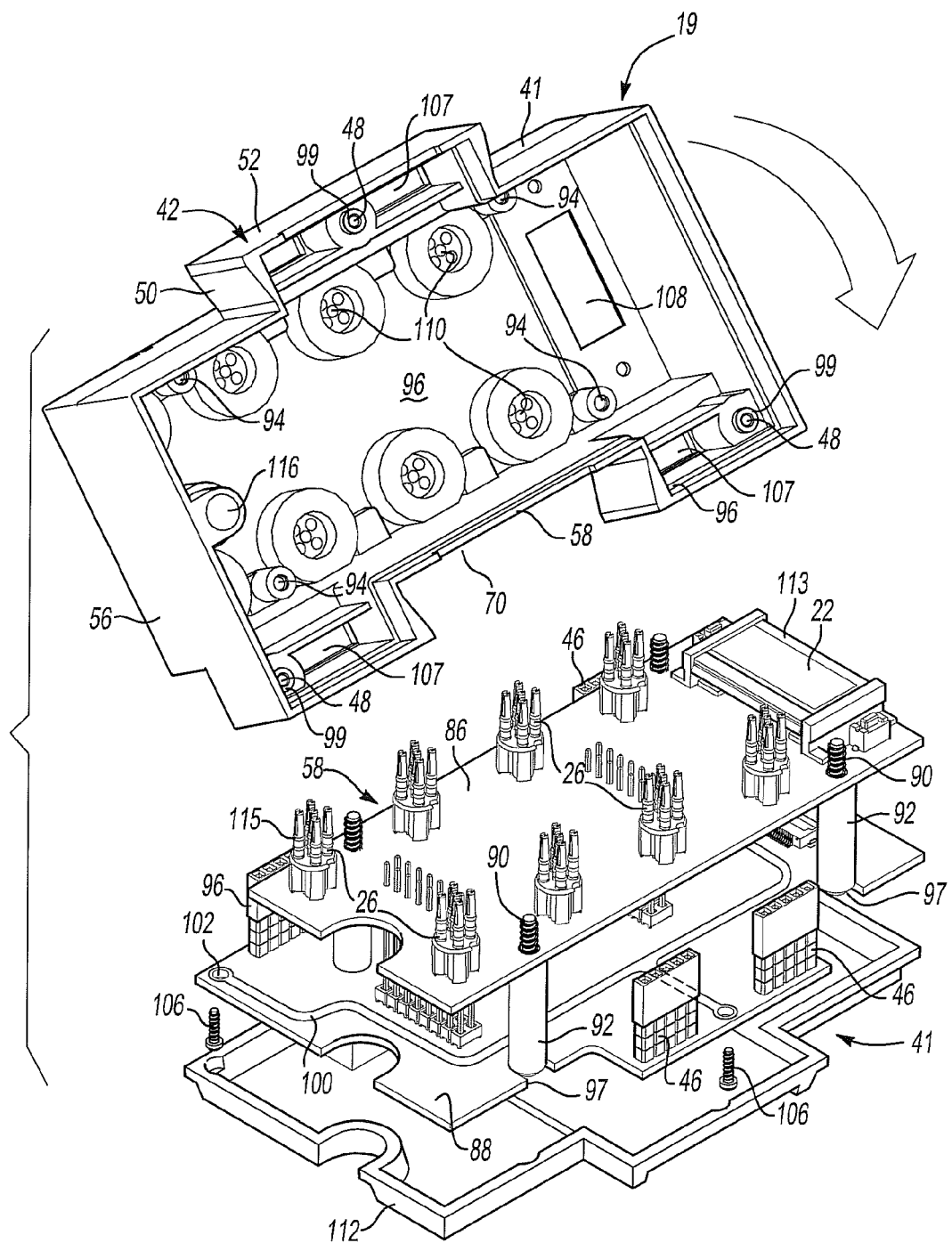
FIG. 6 is an exploded view of the I/O housing shown in FIG. 3.

The interior of the module 18 housing is more clearly shown in FIG. 6 where the housing 19 is opened up to view the interior thereof. The module 18 has a front board 86 that mounts the alpha-numeric graphical display 22 and I/O fittings 26. The display 22 and fitting 26 may be structurally connected in other fashions. A rear board 88 is affixed to and spaced from the front board 86. The boards 86 and 88 are connected to the cover 96 of housing 19 via long fasteners 90 and guide tubes 92 that enter through holes or slots 97 in backboard 88 and extend to front board 86. The long fasteners 90 engage threaded receptacles 94 in the inside of cover 96 of housing 19. The first board 88 is sandwiched between the housing cover 96 and guide tube 92 to be secured. The rear board 88 also mounts the electrical fittings 46 through an appropriate solder connection. Traces (not shown) on board 88 connect the fittings 46 on one side 41 to respective fittings 46 on the other side 58 of housing 19 to transfer power and communication therebetween. The I/O fittings 26 are also electrically connected to board 88 via board 86 to be in communication with both display 22 and fitting 46 where information can then be transferred to main communication module 30.

Figure 9:
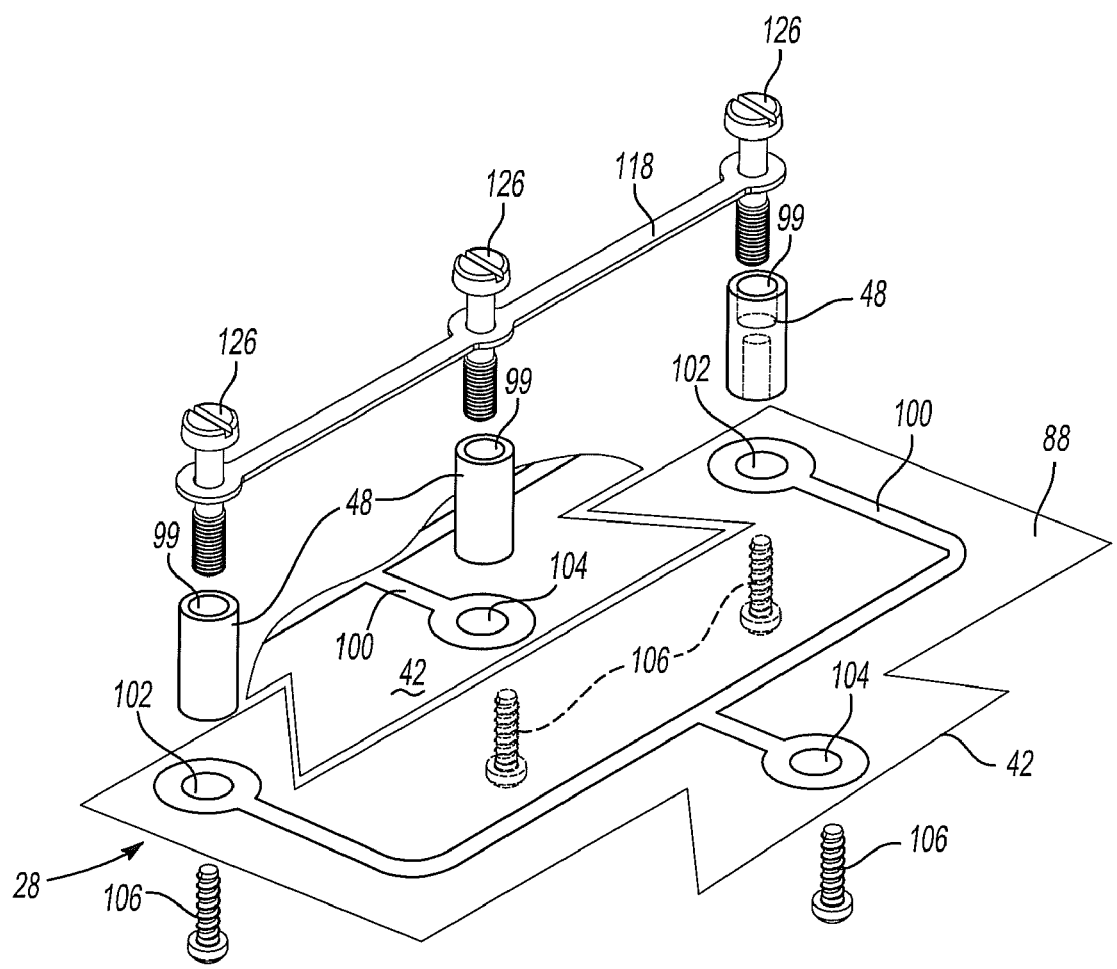
FIG. 9 is a schematic view of the grounding circuit formed by the trace shown in FIG. 6 and the clip shown in FIG. 8.

Referring now to FIG. 9, ground trace 100, for example a ground plane, also extends across the rear board 88 from apertures 102 to aperture 104. The ground trace 100 is in electrical communication with conductive threaded fasteners 106 as they extend through apertures 102 and 104. The fasteners 106 engage the underside of threaded inserts 48 from the interior of cover 96 to mount rear board 88. The threaded inserts 48 are made from an electrically conductive material such as brass or other metal and is molded or affixed into the cover 96 of housing 19. Each insert 48 has two blind holes 99 so that even when fasteners are not engaged thereto, the insert does not allow access from the ambient exterior to the interior of housing 19.

Figure 7:
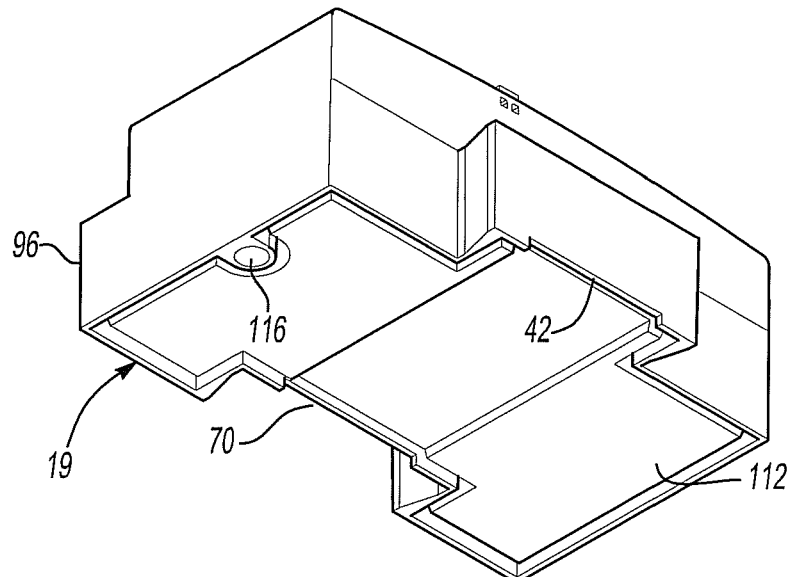
FIG. 7 is a rear perspective view of the I/O module shown in FIG. 3.

Once the board 86 is affixed to cover 96 through long fasteners 90, the boards 86 and 88 are closed within housing 19 by placement of a backing member 112 of housing 19. The backing member 112 may be secured to cover 96 to enclose the components within the housing 19 as shown in FIG. 7. The housing cover 96 has an aperture 116 that passes therethrough that can be used to directly mount the I/O module 18 to the mounting surface 28.

Figure 8:
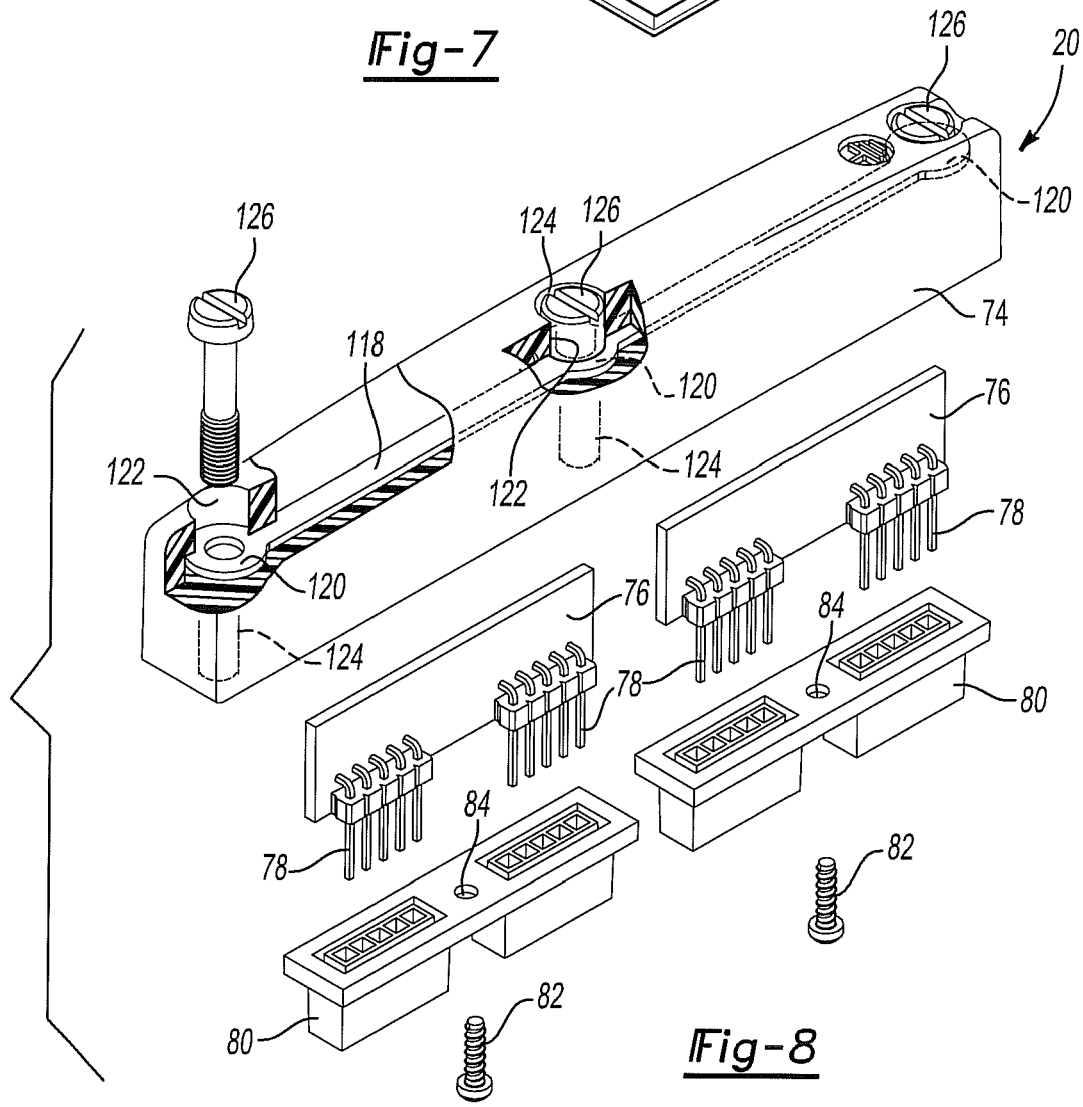
FIG. 8 is an exploded view of the connector clip shown in FIG. 2.

As shown in FIG. 8, the panel 76 has electrically connected fittings 78 which electrically connect to fittings 46 of one module 18 in FIG. 2 and at one side 41 to respective fittings 46 on the other side 58 of another module 18. As such, two continuous electrical circuits are made throughout the entire bank of modules 18. The upper fittings 46 are primarily used to transfer network power and communications to the I/O data circuits for fittings 26 and to fitting 45 in bus-out mounting plate 32. The lower fittings 46 are used to transfer auxiliary power to the I/O module 18 and lower fitting 47 of the bus-out mounting plate 32 and to each I/O module fitting 26. An additional auxiliary power supply may be attached to any of the lower fittings 47 of the bus-in or bus-out plates 31 and 32 to provide for example up to 4 amps at 24 volts. Electrical bus cables 36 and 38 can provide communication and auxiliary power to the remote stations 35 and 40 which also transfer power throughout in the same fashion as the main station 16.

Clip 20 as shown more clearly in FIGS. 2, 5, and 8 has an elongated body 74 housing a pair of electrical circuit boards 76 each with two male fittings 78 that have a protective shroud 80 thereabout. The protective shroud 80 may be held in place to the body via fasteners 82 engaging through the aperture 84 in shroud 80 to engage the body 74. The fittings 78 and shroud 80 each fit and connect to the fittings 46 in the extensions 42 and 60.

The clip 20 also has a molded-in conductive strap 118 that has three annular contact shoulders 120 that are exposed in counter bores 122 about apertures 124. Conductive threaded fasteners 126 extend through the apertures 124, engage the contact shoulders 122 and threaded insert 48 in the extensions 42 and 60 in adjacent modules 18. The fasteners 126 both mechanically affix two adjacent modules together as well as provide a continuous grounding circuit between two adjacent modules 18.

The completion of the grounding circuit is described by a referring to FIGS. 1 and 9. The bus-in and bus-out mounting plates 31 and 32 also have similar grounding straps 118 molded directly therein. End terminating mounting plate 34 may also have a similar grounding strap 118 therein. Fasteners 126 engage the grounding strap 118 as it fastens the mounting plates 31, 32 or 34 to module 18. A ground wire 128 is now placed under any one of the fasteners 126 mounting the modules 18, and mounting plates 31, 32 or 34. The wire 128 is connected to the metal frame of the equipment for example mounting surface 28.

The grounding circuit through the modules 18 and clips 20 is shown schematically in FIG. 9. The fastener 106 passing through aperture 104 engages threaded insert 48 in extension 42 and is in contact with trace 100 of first module 18. A fastener 126 then engages the top of threaded insert 48 in extension 42 which engages the center annular contact shoulder 120 of clip 20. Fasteners 106 and 126 and threaded inserts 48 are all made from a metal or other electrically conductive material. The conductive strap 118 with its center annular contact shoulder 120 extends to the two outer contact shoulders 120. The outer contact shoulders are engaged by conductive fasteners 126 which engage conductive threaded inserts 48 in housing cover 96 at extensions 60. The threaded inserts 48 also engage conductive fasteners 106 which pass through board 88 at apertures 102 and are in electrical contact with the ground trace 100 on rear board 88. The trace 100 extends across board 88 to aperture 104 which then similarly is in electrical contact with a conductive fastener 106 passing through aperture 104. The ground circuit then repeats through the adjacent clip 20 and an adjacent module 18.

The clip 20 thus grounds the modules 18 together. The clip 20 also electrically connects modules 18 together with a power source and auxiliary power connector 43 through fittings 78 that connect to fittings 46 and also mechanically affixes modules 18 together. The interlocking extensions 42, 60 and cavity 70 of two adjacent modules 18 expedites mounting one module 18 to another by temporarily holding the modules 18 in place against mounting surface 28 while they become affixed by clip 20.

Furthermore, this construction provides for an intermediately positioned I/O module to be removed by lifting away from mounting surface 28. By removing adjacent clips 20, the extensions 42, 60 and cavity 70 are exposed and a module 18 can be lifted out. A replacement I/O module 18 can be positioned in the space provided without moving the other I/O modules 18. Optionally, the other I/O modules can be moved together and joined together through the interlocking connection eliminating the space left by the removed I/O module. Furthermore, if an additional I/O module 18 is needed, the plates 31, 32 or 34 can be temporarily removed, to form a space where an additional module 18 can then be introduced and the plates 31, 32 and 34 can be re-connected to complete the mechanical, electrical and ground connection. Furthermore, in similar fashion, an additional module 18 can be introduced between two other modules 18.

The mounting plates 32 and 34 can be used on either the main station 16 or the remote distribution stations 35 and 40. Bus-in plates 31 can be used for the remote stations 35. The modular properties of the I/O modules 18 and the components 31, 32 and 34 provide for a wide range of distribution and optional constructions.

An alternate construction for providing a modular I/O for a fieldbus valve manifold is shown in FIGS. 10-13. In FIGS. 10-13, a module 218 has a housing 219 with a main front face 224 that have I/O fittings 226. The housing 219 has upper and lower shoulders 242 that have front faces 244 recessed with respect to main front face 224. Each shoulder 242 had two electrical connectors 246 and a dovetail shaped cavity 270. Clips 220 each have complementary electrical fittings 278 as shown in FIG. 12 that can connect to connectors 246 to electrically connect adjacent modules 218 together. The clip 220 also has a male dove tail projection 242 that fits within each cavity 270 and mechanically locks the adjacent modules 218 together. The clip also has an aperture 215 that allows a threaded fastener 236 to extend therethrough and engage and backing clip 225 that also has a tapered dovetail projection 245 as shown in FIG. 13.

Each module similarly has an alpha-numeric display 222 which indicates the status or other parameters of each signal connected to fitting 226. Label holders 221 may also be built into each housing 219.

Another embodiment is shown in FIGS. 14-15 where a module 318 has a pair of dove tail shaped cavities 370 positioned at a side recessed shoulder 360 that extend between the lower and upper shoulders 343. An I-shaped clip 320 extends over both lower and upper shoulders 343 to connect the electrical connectors 346 of adjacent modules together through connectors 378 and has a pair of double dovetail projections 342 to engage the cavities 370 to mechanically lock adjacent modules 318 together. The alpha-numeric display 322 may be vertically positioned down the length of the module 318.

FIGS. 16 and 17 disclose another embodiment where the module 418 has electrical fittings 446 on both side shoulders 460 and a single dovetail cavity 470 are aligned. The dove tails of adjacent modules 418 are face to face and engage a dovetail projection 442 of clip 420 which also has two pair of complementary electrical fittings 478. The module 418 has an alpha-numeric display 422.

The electronics of the modular bus I/O system has an alpha-numeric graphical display 22, 222, 322 and 422 or LED, LCD type display that can display the status and other parameters of the I/O modules and the main communication module and other verbiage such as errors or addresses of the modules. The display may be a commercially available pixel display product. It is also foreseen that other LED, LCD or other visual display panels may be suitable. The display 22 has two operating push buttons 130 which may scroll through menus as prepared for the particular modular banks and I/O modules. The display 22 is capable of scrolling longer messages as needed.

The display 22 can be used to display the status of the I/O that is connected. For example a positioned square is lit with the number of the I/O being formed by blackout so the number is viewed in a negative formation within a lighted square.

Proper manipulation of the operating push buttons 130 can scroll through menus to display and adjust certain properties many of which were previously only viewable through external devices. For example, the following node properties may be viewed: network node address, Baud rate, I/O sizes diagnostic information and firmware revision levels. It may also be used to display and allow the user to adjust network address, the Baud rate, the parameters for I/O sizes, and self test mode.

The valve manifold sub-node properties may be viewed for example, I/O range, communication errors, short circuit errors, aux (auxiliary) power status, and firmware revisions. The display 22 may also be used to display and adjust the individual module self test. The I/O module menu may display for example, the I/O range, type analog digital, input, output, input/output, NPN or PNP, communication errors, short circuit errors, aux power status, analog signals, firmware revisions, and may be used to display and allow the user to adjust the individual module self test mode and debouncing delay settings. An electronic alpha-numeric display 22 as shown in FIG. 1 may also be mounted on the main communication module 30 for displaying viewable and settable parameters relating to the main communication module 30 and other modules and devices connected to it.

The main network attached to the fieldbus system has a host controller that allows each attached module to be addressed. Rather than manually setting dip switches, there can be an auto address scheme where each module is sequentially addressed so the main communication module knows where the signal of the particular I/O fitting 26 resides.

An optional memory board may be incorporated into the main communication module or as an additional module which can save the initial parameters. The parameters can then be changed at an I/O module and downloaded back to the memory module. A manual configuration board can be substituted for the memory board. In this structure configuration, one can replace the main communication node without reconfiguration of the new unit.

Each I/O module may have an internal sensing circuit that automatically recognizes when the network power falls below a usable level and will automatically switch to the auxiliary power source provided by the lower fitting 43 in the main communication module 30 from the sub-network power also provided through the lower fitting 43 in the main communication module 30. If one power system falters or stops, there may be an automatic switch to change over to the other power source. Auxiliary power may also be provided to a lower fitting 47 in the bus-in plate 31.

In this fashion a flexible distribution bus system can be made from housing components made from plastic or other types of desirable materials that are non-conductive by incorporating a separate grounding system built therein. The ground system no longer relies on the conductivity and abutment of metallic housings of the modules. The individual I/O modules are self contained and protectively enclose the electronic boards. The modularity and self containment of the modules allows them to be removed and remotely mounted by themselves as remote substations either individually or with other connected modules and valves.

The removal and replacement of the modules are expeditiously accomplished through its unique connecting structure. The clip easily connects the modules together and the modules are constructed to provide transitional integrity of assembly while the clip is being connected to adjacent modules. Furthermore, the modules by being self contained units can be remotely positioned without the need of specialized end plates.

The display 22, 222, 322, 422 can allow the user to see important properties by scrolling through a menu as needed and even remotely adjust certain properties. The modules automatic addressing system and automatic power selection provides for a more trouble free and updated fieldbus system that is particularly useful for solenoid actuated manifold valve and I/O systems. Modules as used in this application may cover a stand alone unit which houses a display.

Other variations and modifications are possible without departing from the scope and spirit of the present invention as defined by the appended claims.

The embodiments in which an exclusive property or privilege is claimed are defined as follows:

1. An electrical bus communication assembly comprising:
    a main communication module;
    a main bank of modular I/O units mounted to a first side of the main communication module and adjacent each other;
    each modular I/O unit having an electrical fitting in proximity to each side thereof and being connected to a respective complementary electrical fitting of one of an adjacent I/O unit and main communication module;
    each modular I/O unit being removable from and installable to said bank of modular I/O units without removing any other modular I/O unit and main communication module;
    each modular I/O unit enclosing electronic boards therein and being distributable to a remote location from said main communication module and said main bank and remaining electrically connectable to the main bank and main communication module from said remote location via a cable or wireless communication medium; and
    said main communication module constructed to automatically address each modular I/O unit with a sub-network address on either the main bank or on the remote location.

2. An electrical bus communication system as defined in claim 1 further comprising:
    a valve manifold having operable valves operably connected to a second side of said main communication module opposite from said first side.

3. An electrical bus communication system as defined in claim 2 further comprising:
    at least one modular I/O unit constructed to automatically select a choice of two power sources fed into each modular I/O unit.

4. An electrical bus communication system as defined in claim 3 further comprising:
    at least one modular I/O unit having an electronic alpha-numeric display thereon for displaying information relative thereto.

5. An electrical bus communication system as defined in claim 4 further comprising:
    said electronic alpha-numeric display having operable buttons for scrolling through menus and different indicia relating to different parameters of a respective modular I/O unit.

6. An electrical bus communication system as defined in claim 4 further comprising:
    said main communication module having an electronic alpha-numeric display thereon for displaying information relative thereto.

7. An electrical bus communication system as defined in claim 2 further comprising:
    at least one modular I/O unit having an electronic alpha-numeric display thereon for displaying information relative thereto.

8. An electrical bus communication system as defined in claim 7 further comprising:
    said electronic alpha-numeric display having operable buttons for scrolling through menus and different indicia relating to different parameters of a respective modular I/O unit.

9. An electrical bus communication system as defined in claim 7 further comprising:
    said main communication module having an electronic alpha-numeric display thereon for displaying information relative thereto.

10. An electrical bus communication system as defined in claim 1 further comprising:
    at least one modular I/O unit having an electronic alpha-numeric display thereon for displaying information relative thereto.

11. An electrical bus communication system as defined in claim 10 further comprising:
    said electronic alpha-numeric display having operable buttons for scrolling through menus and different indicia relating to different parameters of a respective modular I/O unit.

12. An electrical bus communication system as defined in claim 10 further comprising:
    said main communication module having an electronic alpha-numeric display thereon for displaying information relative thereto.

13. An electrical bus communication system as defined in claim 1 further comprising:
    said main communication module having an electronic alpha-numeric display thereon for displaying information relative thereto.

14. An electrical bus communication system as defined in claim 13 further comprising:
    said electronic alpha-numeric display having operable buttons for scrolling through menus and different indicia relating to different parameters of a main communication module.

15. An electrical bus communication system comprising:
    a main communication module constructed to be physically connected to an I/O unit;

at least one I/O unit constructed to be physically connected to said main communication module along a main bank that includes said main communication module;

said at least one I/O unit constructed to be distributable to a remote location from said main bank and remaining electrically connectable to said main communication module from said remote location via a cable or wireless communication medium; and said main communication module constructed to automatically address said at least one I/O unit with a sub-network address on either the main bank or on a remote location.

16. An electrical bus communication system as defined in claim 15 further comprising:

at least one modular I/O unit constructed to automatically select a choice of two power sources fed into said at least one modular I/O unit.

17. An electrical bus communication system as defined in claim 15 further comprising:

said at least one modular I/O unit having an electronic alpha-numeric display thereon for displaying information relative thereto.

18. An electrical bus communication system as defined in claim 17 further comprising:

said electronic alpha-numeric display having operable buttons for scrolling through menus and different indicia relating to different parameters of a respective modular I/O unit.

19. An electrical bus communication system as defined in claim 15 further comprising:

said main communication module having an electronic alpha-numeric display thereon for displaying information relative thereto.

20. An electrical bus communication system as defined in claim 19 further comprising:

said electronic alpha-numeric display having operable buttons for scrolling through menus and different indicia relating to different parameters of said main communication module.

21. An electrical bus communication system as defined in claim 15 further comprising:

said I/O unit having a first side with an interlocking extension of a first shape; and said I/O unit having a second opposite side with two spaced interlocking extensions with a cavity therebetween that is complementary shaped to interlock with an interlocking extension of said first shape.

22. An electrical bus communication system as defined in claim 21 further comprising:

an electronic alpha-numeric display mounted on a main front face of said I/O unit; and said interlocking extensions having front faces recessed with respect to a main face of said I/O unit.

23. An electrical bus communication system as defined in claim 22 further comprising:

said electronic alpha-numeric display being manually manipulated for scrolling through menus and different indicia relating to different parameters of said I/O unit.

24. An electrical bus communication system as defined in claim 23 further comprising:

said electronic alpha-numeric display having operable buttons for scrolling through menus and different indicia relating to different parameters of said I/O unit.

25. An electrical bus communication system as defined in claim 15 further comprising:

said main communication module having a first side with at least one interlocking extension of a first shape for interlocking with at least one complementary shaped extension on said I/O module.

26. An electrical bus communication system as defined in claim 25 further comprising:

an electronic alpha-numeric display mounted on a main front face of said main communication module; and said at least one interlocking extension having a front face recessed with respect to a main face of said main communication module.

27. An electrical bus communication system as defined in claim 26 further comprising:

said electronic alpha-numeric display being manually manipulated for scrolling through menus and different indicia relating to different parameters of said main communication module.

28. An electrical bus communication system as defined in claim 27 further comprising:

said electronic alpha-numeric display having operable buttons for scrolling through menus and different indicia relating to different parameters of said main communication module.

* * * * *

UNITED STATES PATENT AND TRADEMARK OFFICE
CERTIFICATE OF CORRECTION

| | | |
|---|---|---|
| PATENT NO. | : 7,896,711 B2 | Page 1 of 1 |
| APPLICATION NO. | : 12/797728 | |
| DATED | : March 1, 2011 | |
| INVENTOR(S) | : Enrico De Carolis et al. | |

It is certified that error appears in the above-identified patent and that said Letters Patent is hereby corrected as shown below:

ON THE COVER PAGE

Line (74) Attorney, Agent or Firm - Delete "Reisong Ethington P.C.", insert --Reising Ethington P.C.--

Signed and Sealed this
Fifth Day of July, 2011

David J. Kappos
*Director of the United States Patent and Trademark Office*